US 7,457,736 B2

(12) United States Patent
Chang (10) Patent No.: US 7,457,736 B2
(45) Date of Patent: Nov. 25, 2008

(54) AUTOMATED CREATION OF METROLOGY RECIPES

(75) Inventor: Fang-Cheng Chang, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 654 days.

(21) Appl. No.: 10/301,225

(22) Filed: Nov. 21, 2002

(65) Prior Publication Data

US 2004/0102934 A1 May 27, 2004

(51) Int. Cl.
G06F 17/50 (2006.01)
G06F 19/00 (2006.01)
G01R 31/26 (2006.01)

(52) U.S. Cl. ............... 703/13; 716/4; 716/8; 438/7; 438/14; 700/121

(58) Field of Classification Search ............... 703/13; 716/4, 19, 20; 700/121; 438/7, 14, 16
See application file for complete search history.

(56) References Cited

U.S. PATENT DOCUMENTS

| 5,717,204 | A | * | 2/1998 | Meisburger et al. ......... 250/310 |
| 6,000,281 | A | | 12/1999 | Burke |
| 6,128,403 | A | * | 10/2000 | Ozaki ......................... 382/145 |
| 6,130,750 | A | | 10/2000 | Ausschnitt et al. |
| 6,225,639 | B1 | | 5/2001 | Adams et al. |
| 6,268,093 | B1 | | 7/2001 | Kenan et al. |
| 6,346,426 | B1 | | 2/2002 | Toprac et al. |
| 6,370,679 | B1 | | 4/2002 | Chang et al. |
| 6,374,199 | B1 | | 4/2002 | Sugimoto |
| 6,452,677 | B1 | | 9/2002 | Do et al. |
| 6,559,924 | B2 | * | 5/2003 | Ina et al. ......................... 355/53 |
| 6,578,188 | B1 | * | 6/2003 | Pang et al. ..................... 716/19 |
| 6,658,640 | B2 | * | 12/2003 | Weed ............................. 716/19 |
| 6,674,391 | B2 | * | 1/2004 | Ruszkowski, Jr. ......... 342/25 R |
| 6,748,578 | B2 | * | 6/2004 | Cobb ............................. 716/19 |
| 6,831,997 | B2 | * | 12/2004 | Kamon ........................ 382/144 |
| 6,886,153 | B1 | * | 4/2005 | Bevis ............................ 716/19 |
| 6,954,911 | B2 | * | 10/2005 | Pierrat ............................ 716/4 |
| 6,961,920 | B2 | * | 11/2005 | Zach ............................. 716/21 |

(Continued)

FOREIGN PATENT DOCUMENTS

WO WO 00/36525 6/2000

OTHER PUBLICATIONS

Jason Groce, Advanced Process Control Framework Initiative (APCFI) Project: Overview, SeMatech International Jun. 30, 1999 consisting of 25 pages.

*Primary Examiner*—Paul L Rodriguez
*Assistant Examiner*—Andre Pierre Louis
(74) *Attorney, Agent, or Firm*—Kenta Suzue; Haynes Beffel & Wolfeld LLP (57) ABSTRACT

An automated metrology recipe set up process is described for a manufacturing process, in which patterns to be formed on a device are defined using a design database. The design database is processed to produce a simulated image of a feature for use in a metrology tool for a measurement of the feature. The simulated image is supplied to the metrology tool, where it is used as a basis for alignment of the tool for the measurement. Other recipe data is combined with the simulated image to provide a fully automated metrology set up process.

66 Claims, 7 Drawing Sheets

U.S. PATENT DOCUMENTS

| | | | |
|---|---|---|---|
| 6,988,060 B1 * | 1/2006 | Coon et al. | 703/13 |
| 7,030,997 B2 * | 4/2006 | Neureuther et al. | 356/515 |
| 7,155,699 B2 * | 12/2006 | Cobb | 716/19 |
| 2003/0223630 A1 * | 12/2003 | Adel et al. | 382/145 |
| 2003/0226951 A1 * | 12/2003 | Ye et al. | 250/208.1 |

* cited by examiner

FIG. 1

LAYOUT DATABASE IMAGE

FIG. 2

SIMULATED IMAGE

FIG. 3

ALIGNMENT IMAGE FOR RECIPE

AUTOMATED CREATION OF METROLOGY RECIPES

BACKGROUND OF THE INVENTION

1. Field of the Invention

The present invention relates to metrology in the field of manufacturing integrated circuits, lithographic masks used in integrated circuit design and other complex devices having small features. More particularly, the present invention relates to a process for developing recipes for metrology for such products.

2. Description of Related Art

Integrated circuits and other complex devices having small features are manufactured using lithographic processes. As the size of the features in integrated circuits and other devices manufactured using such processes shrinks, control over the dimensions of the small features becomes more critical. Because of variations in coherence, intensity and focus of the radiation utilized, and variations in the materials utilized for pattern definition, like photoresist, and in the composition of the materials (e.g. polysilicon, dielectrics and metals) used for structures on the devices, the lithographic processes require continual monitoring and measurement to ensure that the dimensions of the patterns being formed fall within acceptable ranges.

Measurements of dimensions of such features is generally referred to as metrology in the lithographic arts. Typically, metrology in the semiconductor industry relies on top-down scanning electron microscopes SEMs for metrology of critical dimensions for sub-micron features. Optical microscopes are utilized, as well. A wide variety of tools is also available for metrology. A discussion of background for metrology in the integrated circuit arts is provided in Ausschnit et al., U.S. Pat. No. 6,130,750. See also, Toprac et al., U.S. Pat. No. 6,346,426.

For efficient, automated metrology, it is important to develop a metrology recipe which identifies features to be measured, and provides parameters to the metrology tool necessary to find the feature, set up the tool and measure the feature. The set of features to be measured must be sufficient in number and in distribution on the device, to provide reliable information about the manufacturing process. However, in prior art approaches, the set of features to be measured is manually selected, and the metrology tools are manually set up by skilled engineers, using painstaking study of the layout. Therefore, the set of features to be measured must be efficiently determined and limited to a number that can be effectively achieved without undue expense.

To set up a recipe for many wafer metrology tools, a manual first pass is necessary to handpick the features the user wants to measure, and set the locations on the features for the measurements. For high precision tools, such as SEMs, it is also necessary capture an image of the feature to be measured at each measurement location within the device. The recipe is used by the tool to scan to each measurement location on the device being manufactured, and using an image recognition process based on the recipe image, to align the tool for proper measurement of the real-time image. The manual process of finding locations and taking the images can be very time-consuming, requires skilled engineers, and limits the number of measurement locations that can be practically set up.

The problem of selecting which features to inspect on a device, further complicates the metrology set up process, for devices having millions of features defined by lithography. It has been proposed, as set out in Glasser, et al., International Patent Application Publication No. WO 00/36525, to provide design databases for reticles in which critical features of the reticles are flagged for enhanced inspection of the reticles and of integrated circuit layers formed using the reticles, and for enhanced attention during manufacture. Also, simulation of a target pattern to be formed on integrated circuits for the flagged features is described, for use as base line images in the enhanced defect analysis.

It is desirable therefore to provide techniques for establishing metrology recipes, and for accomplishing metrology for manufacturing lines using lithographic techniques, that are more effective and less expensive than the techniques of the prior art.

SUMMARY OF THE INVENTION

The present invention provides an automated metrology recipe set up process overcoming the limitations of prior art techniques. According to the present invention, recipe set up is not dependent on an engineer sitting down with an actual product, e.g. wafer or mask, and scanning the product for likely locations for measurements, and taking images of such locations for input to metrology tool. Rather, metrology set up is accomplished using simulation, and leveraging the power of data processing resources.

For a manufacturing process, such as integrated circuit manufacturing and lithographic mask manufacturing, in which patterns to be formed are defined using a design database, features for metrology are determined by processing the design database, including in some embodiments, reviewing simulated images of features in the design. Images used for alignment of the measurement tool are simulated, locations for measurement on the selected features are set, and other tool specific recipe data is provided for the selected locations. A graphical user interface facilitates the selection of features, the setting of measurement locations on the features, and the capturing of simulated images of the features. The present invention is used with a variety of metrology tools including, but not limited to, the following:

Optical microscopes
Scanning electron microscopes (SEM)
Transmission electron microscopes (TEM)
Atomic force microscopes (AFM)
Focus Ion Beam microscopes (FIB)
Scanning Tunneling Microscopes (STM)
Near-Field Optical Microscopes (NFM)

The present invention is embodied by a method for setting up a metrology tool used to measure features of the device, such as a layer of an integrated circuit or a lithographic mask, which is characterized by design database such as a layout file for a reticle used to define the pattern of the layer or the pattern of the mask. The method includes processing the design database to produce recipe data for measurements of features in a set of selected features on the device. The recipe data includes locations for measurements for corresponding features in the set of selected features, and set up data for the metrology tool. In one approach to implementing the invention, the recipe data, including simulated images, are generated and stored on a server and the resulting recipes are downloaded/accessed on the clients (e.g. equipment) as requested. The recipe data is used by a client metrology tool for measurements using the metrology tool.

The recipe data includes an image of at least one of the features in the set of selected features. In one embodiment, the image is produced by simulation tools, and stored with the recipe data in machine-readable memory accessible by a controller for the metrology tool. The image is used with image recognition software in the metrology tool, for alignment of the metrology tool during set up of the measurement. Image recognition software enables precise alignment at a location on the feature specified in the recipe data.

Embodiments of the method include applying rules that filter features in the design database according to characteristics of the features, such as proximity to other features and size, to produce the set of selected features. For example, the set of selected features may include features that had been flagged as features having a critical dimension in the design database. Further, the set of selected features may include features that had been flagged critical in the design database, in combination with being positioned in a region on the device in which metrology is desired. The set of selected features may include features in a layout of an array, positioned in a distribution over the array, even a random distribution in some embodiments, for the purposes of measuring uniformity in thickness or line width across the array.

In yet another embodiments, the selected features are identified by rules that specify a "halo" corresponding to a particular feature that characterizes an area surrounding the particular feature, and identify features in the design database for which another feature overlaps the halo of the particular feature.

In yet another embodiments, a graphical user interface is utilized in which simulated images of the device are presented to a user, and input tools are used for selecting the features for measurements. Simulated images can also identify where there are process sensitive locations in the layout, likely to cause a problem for the device on the wafer. Error flags, such as those provided in commercially available SiVL® software from Numerical Technologies, Inc, of San Jose, Calif., can be used to identify such locations. The selected features are then presented in a manner that facilitates identifying a location on the selected feature for measurement, and for capturing a simulated image of the feature for use in aligning the metrology tool at the identified location on the feature in a real device.

In embodiments of the invention, a graphical user interface is provided, which is adapted to present candidate features in an order to user. The candidate features are determined by filtering the design database, by using flagged critical features from the design database, or otherwise. The user traverses the candidate features, selecting particular features for metrology, identifying measurement locations on the particular features, and capturing simulated images of the features for use in the recipe data.

Embodiments of the invention also include metrology steps based on the recipe data gathered as described above. Thus, the metrology process includes reading recipe data for measurement corresponding to the feature in the set of selected features. Using recipe data, a controller drives metrology tool to a location indicated for the measurement. In preferred embodiments, a simulated image is used with image recognition software for alignment of the tool during set up for the measurement. The measurement is captured at the location, and the processes of reading, driving and capturing is repeated until measurements are made for the features in the set a selected features.

The invention is particularly suited for manufacturing of integrated circuits using lithography techniques. In this embodiment, the process of using the recipe data is repeated for the features in the set of selected features on the first die on a wafer, and then the metrology tool is driven to a next die on the wafer for measurement of the set of selected features on the next die.

In yet another embodiments, the design database comprises a hierarchical database, with nodes in hierarchy corresponding with features on the device. The recipe data in this embodiment is linked with corresponding nodes in hierarchy, enabling reuse and improving efficiency of the metrology set up process.

The invention is also embodied by metrology systems, and by data processing systems, configured to execute methods described above. In other embodiments, the invention comprises computer programs stored in machine-readable media including instructions for executing the processes described above.

Other embodiments of the invention comprise manufacturing lines, in which metrology is utilized in real-time control for manufacturing, based on recipe data provided as described above, improving the accuracy and throughput of the manufacturing process.

Other aspects and advantages of the present invention can be seen on review of the drawings, the detailed description and the claims, which follow.

DETAILED DESCRIPTION

Figure 1:
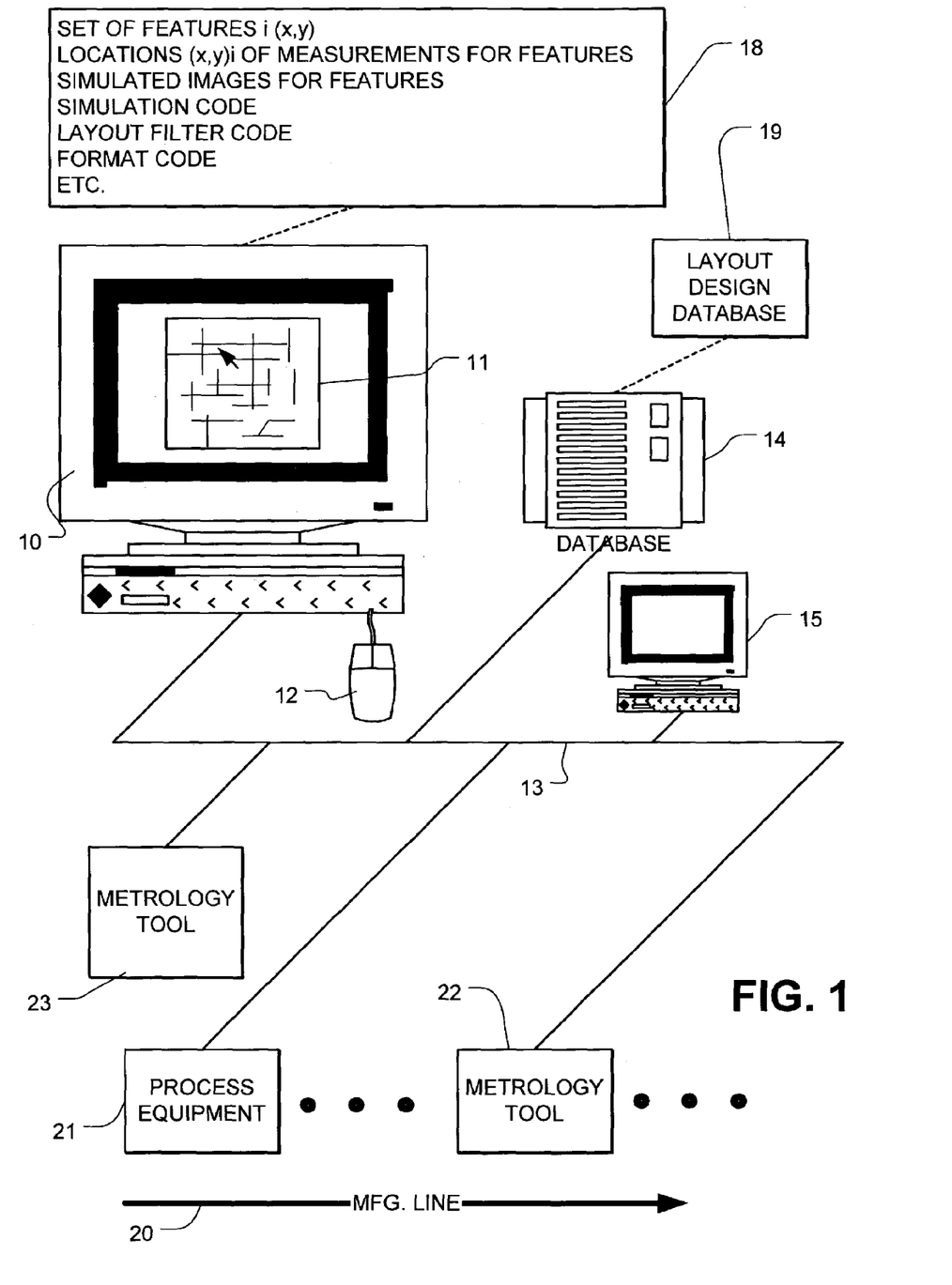
FIG. 1 is a simplified diagram of a manufacturing line including a metrology system and data processing system implementing the present invention.

A detailed description of embodiments of the present invention is provided with reference to FIGS. 1-9. FIG. 1 schematically illustrates a manufacturing line 20 including process equipment 21 coupled with a metrology system, including metrology tool 22, metrology tool 23, and a data processing system, including workstations 10 and 15 and database storage system 14, executing programs of instruction, implemented with features of the present invention. The metrology tools 22, 23 include controllers coupled to the network 13, which execute programs of instruction in support of the measurement process. In a preferred system, the manufacturing line 20 comprises an integrated circuit fabrication line, applying lithographic techniques for the definition of features in layers of material used for implementation of integrated circuits on semiconductor wafers. In other embodiments, the manufacturing line comprises a lithographic mask manufacturing line.

Components of the system shown in FIG. 1 are interconnected by a communication network 13. The workstation 10 in this embodiment executes code for setting up the metrology tools 22 and 23. The workstation 10 includes a display on which a graphical user interface 11 is presented, an input device, such as a keyboard (not shown) and a mouse 12, by which a user interacts with the graphical user interface 11. In this embodiment, the graphical user interface 11 displays a representation, retrieved from the database 14 or simulated in the data processing system using layout data and simulation code, of the device in which features for metrology are to be selected. The user manipulates a pointer with the mouse 12 or otherwise, for selecting features in the displayed representation. Alternatively, the selection of features for metrology tool set up may be fully automated by filtering a design database, in response to flags in a design database, or otherwise.

Also, the database storage system 14 is coupled to the network 13, and stores a layout design database 19 for use by data processing equipment on the network 13, including workstation 10. An additional workstation 15 is coupled to the network 13, and is used for other processes associated with the manufacturing line 20, including for example, controlling the flow of integrated circuit wafers, controlling process equipment 21, and other processes. The controllers for the metrology tools 22, 23 are also coupled to the network 13 in this embodiment. The metrology tools 22, 23 accept recipe data as input for features to be measured, including a location of the feature in the layout, a location and arrangement of the measurement on the feature, an image for use with image recognition software in the metrology tool 22, 23 for alignment of the tool, and other tool specific parameters such as illumination, contrast, and so on required for consistent measurement of the features.

In one representative system, the data processing system, metrology tools, and processing equipment are interconnected by a protocol such as the computer integrated manufacturing algorithm according to the Advanced Process Control Framework, published by International Sematech (Technology Transfer #99053735A-TR, Jun. 30, 1999). A wide variety of computer communication protocols may be utilized for interconnecting the components of the system, as known in the art.

Set up of recipe data for them metrology tools 22 and 23 is accomplished using the workstation 10 in this embodiment. The workstation 10 is coupled to a memory system, schematically memory 18, the data storage system 14, and other memory accessible by the data processor in the workstation 10, which stores data and programs of instruction. The data and programs instruction include information about a set of features, locations (x,y) for measurements on such features, simulated images for such features, simulation code, layout filter code, data communication format code, and other supporting data and programs. The architecture of the data processing system is set up in a client/server paradigm in one preferred approach, so that the recipes, including simulated images, are generated and stored on a server, such as workstation 10, and the resulting recipes are downloaded/accessed on the clients (e.g. metrology tools 22,23) in response to requests by the control program for the metrology tool. A similar client/server approach is used in the commercially available mask inspection tools iVSS and iVirtual Stepper® available from Numerical Technologies, Inc. of San Jose, Calif.

Figure 2:
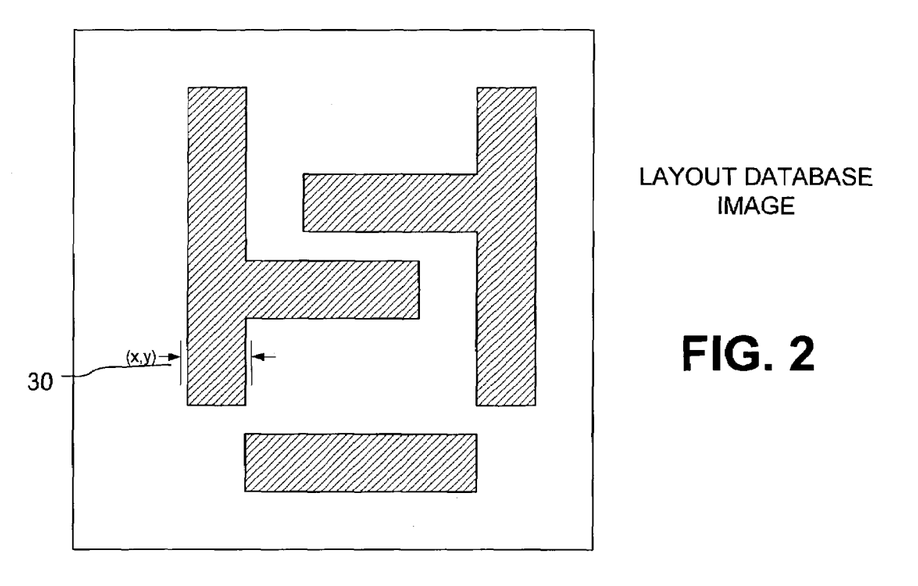
FIG. 2 shows a simplified diagram of a layout database image suitable as input for one embodiment of the present invention, and shows a location for a measurement on a selected feature.
Figure 3:
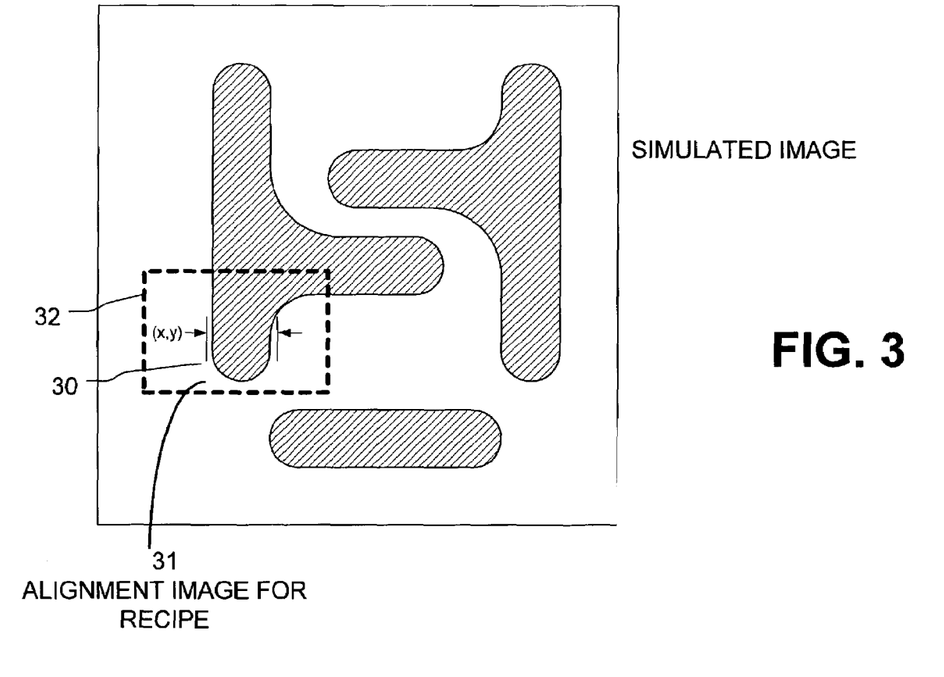
FIG. 3 shows a simplified diagram of a simulation of the layout shown in FIG. 6, and an alignment image captured for use as recipe data.

FIGS. 2 and 3 show a layout database image and a simulated image respectively, using the process of generating recipe data for measurements. In one embodiment of the invention, the graphical user interface display is a layout image of a candidate feature composed from a layout database. The layout database may be a target design used as input to a mask manufacturing process, such as for this example that shown in the GUI 11 n FIG. 1. An operator selects the candidate feature, and indicates a location 30 on the layout database image at which a measurement is desired. Simulation code is executed to produce the simulated image shown in FIG. 3. The location 30 for measurement on the feature is displayed on the simulated image, and in some embodiments is available for fine-tuning by the user. Also, an alignment image 31 for the recipe is created from the simulated image. The boundary 32 of the alignment image 31 is automatically generated depending on the particular tool for which the recipe is being generated. Alternatively, the boundary 32 of the alignment image 31 is generated manually using the graphical user interface. The representative image used for alignment is produced using simulation in preferred embodiments. However, the representative image used for alignment may be captured and stored in other ways. For example, the images may be captured from a database of previously simulated alignment images. Furthermore, the simulated image may be further processed to account for metrology tool specific requirements, or the simulation code may be modified to take into account metrology tool specific requirements, for the image to be used for alignment. Depending on the image recognition software and hardware used by the metrology tool, the alignment image in the recipe data may perform better if it is produced by a device specific process.

As mentioned above, the layout database may be hierarchical database in which nodes correspond to features in the layout. The recipe data in this embodiment is associated with the node utilized for the selected feature, by including pointers in the node data to memory locations of recipe data files, or otherwise.

Also, the hierarchical database may flag certain features as critical features. In this embodiment, the graphical user interface presents the flagged features as candidate features in an order to the user. The user traverses the candidate features presented by the graphical user interface, selecting particular features for measurement, and producing recipe data for the selected features.

In addition to the location 30, and at least one of the stored simulated image and a pointer to the stored simulated image the alignment image 31, additional recipe data may be provided. The additional recipe data may be input by the user, generated automatically based on an expert system database using the parameters of the metrology tool in question, and the parameters of the material being measured, or a combination of user input and automatically generated data. For example, a full all-level localized capture of the electrical circuit in question may be included. Also, parameters associated with the circuit, including priorities, importance levels, expected and target critical dimensions, tolerances and the like, may be included in the metrology recipe data.

Features selected for measurement on layers of integrated circuit devices include portions of lines, trenches, contact vias, contact pads, corners, edges, regions in which more than one layer overlap such as the channel of a transistor in a diffusion layer and the gate of the transistor in a polysilicon layer, and many other features. Measurements made using metrology tools are aligned using the simulated images, with the features in manners depending on the type of measurement. The type of measurements include the width of lines, the depth of trenches, the alignment of edges of contact vias with other features, the distance between edges and other features, the thickness of layers, and so on.

Metrology tools used for making such measurements include optical microscopes, scanning electron microscopes SEM, transmission electron microscopes TEM, atomic force microscopes AFM, and variety of other tools. Each tool may require tool specific formats for recipe data, and tool specific parameters in the recipe data. Thus, the preferred system includes software for formatting the recipe data for the particular tool in use.

For optical microscopes in addition to the location and representative images for alignment, recipe data may include illumination parameters to establish sufficient contrast, like wavelength λ, partial coherence factor σ, image focus, numerical aperture N.A. settings, filter selections and illumination level. For scanning electron microscopes, transmission electron microscopes and atomic force microscopes, the recipe data may include similar parameters unique to the tool.

Figure 4:
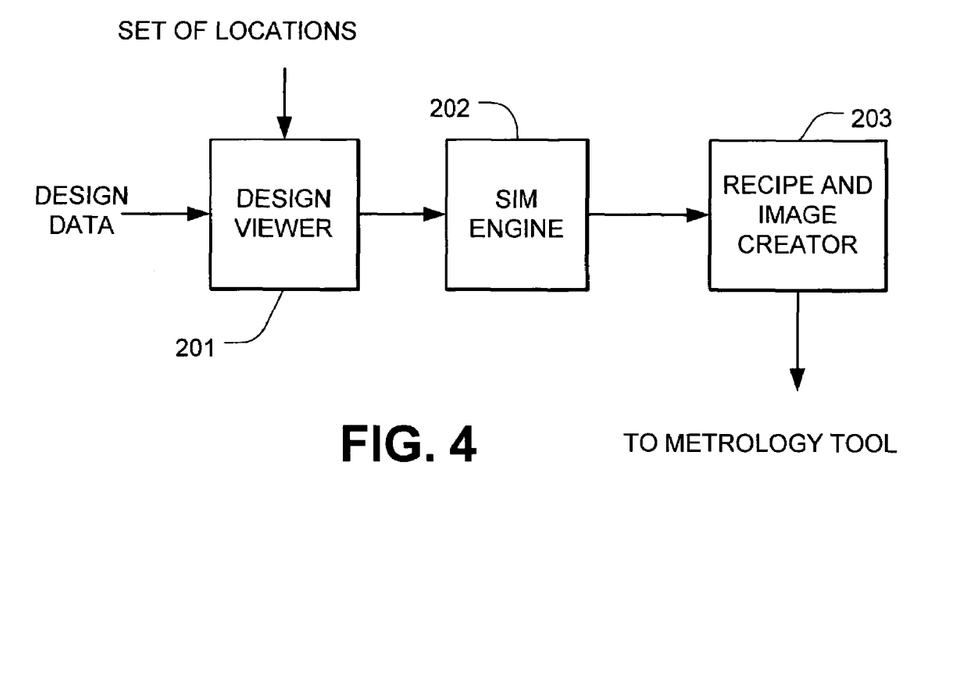
FIG. 4 is a basic flow diagram illustrating aspects of the present invention.

FIG. 4 illustrates a basic flow for setting up a metrology tool according to the present invention. Design data and a set of features are supplied to a design viewer 201, such as a graphical user interface running in the workstation 10 described with reference to FIG. 1. The design viewer is coupled with a simulation engine 202, and passes parameters, including design data related to the features and locations on the features for measurements, used to control the simulation engine 202 to produce the representative image for use by the metrology tool in the alignment. The simulation engine 202, in this example, passes the recipe data including the simulated, representative image to the recipe and image file creator 203, which provides the recipe data to the metrology tool in the format expected by the metrology tool. In embodiments of the present invention, the process of FIG. 4 is entirely automated.

Figure 5:
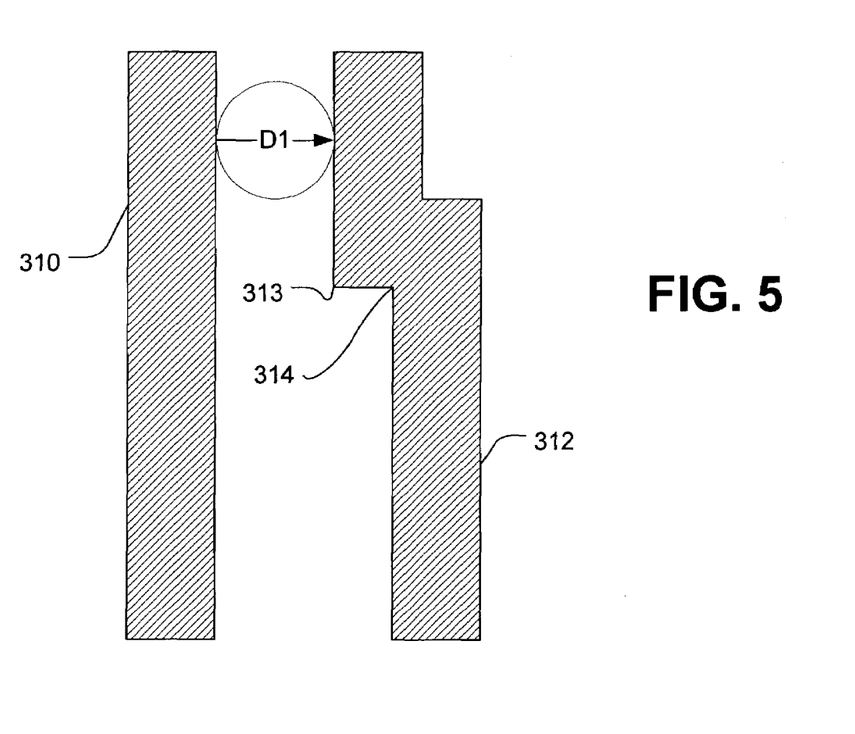
FIG. 5 is a heuristic diagram used for explanation of a filtering process for a design database.

FIG. 5 illustrates one automated technique for identifying a set of candidate features by filtering a design database, as input to a workstation, such as workstation 10 described above with reference to FIG. 1. In FIG. 5, a first line 310 and a second line 312 from the layout database are displayed. The first line 310 is straight. The second line 312 includes a first corner 313 at which the line turns away from line 310, and a second corner 314 at which line 312 turns 90 degrees back parallel with line 310. Thus, the distance between the lines 310 and 312 changes in the portion of the layout shown in FIG. 5. A computer program for filtering a design database assigns a halo based on the diameter D1, for features of the layout. The line 310 has a halo defined by moving the imaginary circle having diameter D1 around the edges, such as line 310, of the feature. As can be seen, the halo defined by diameter D1 contacts the edge of line 312 along the top portion of line 312, and does not contact line 312 along the bottom portion. Thus, the filter software may identify the portion of the layout above the corner 313, and between the lines 310 and 312 as a candidate feature, for which a measurement location will be set. The filter will identify all portions of the layout, in which a feature overlaps a halo of another feature in this example. Alternatively, candidate features may be identified as described in the Glasser et al., International Patent Application Publication No. WO 00/36525, referred to above. Other techniques for identifying candidate features include random selection, systematic scanning of the layout with presentation of features using the graphical user interface to the user, and other processes. For example, in some embodiments, dummy features are automatically filtered out, using the approach described in Chang, et al., International Patent Application No. PCT/GB2002/003812, entitled "System and Method for Identifying Dummy Features on a Mask Layer," and assigned to the assignee of the present application. By filtering dummy features, the process on selecting metrology sites may focus on main features of the layout.

Figure 6:
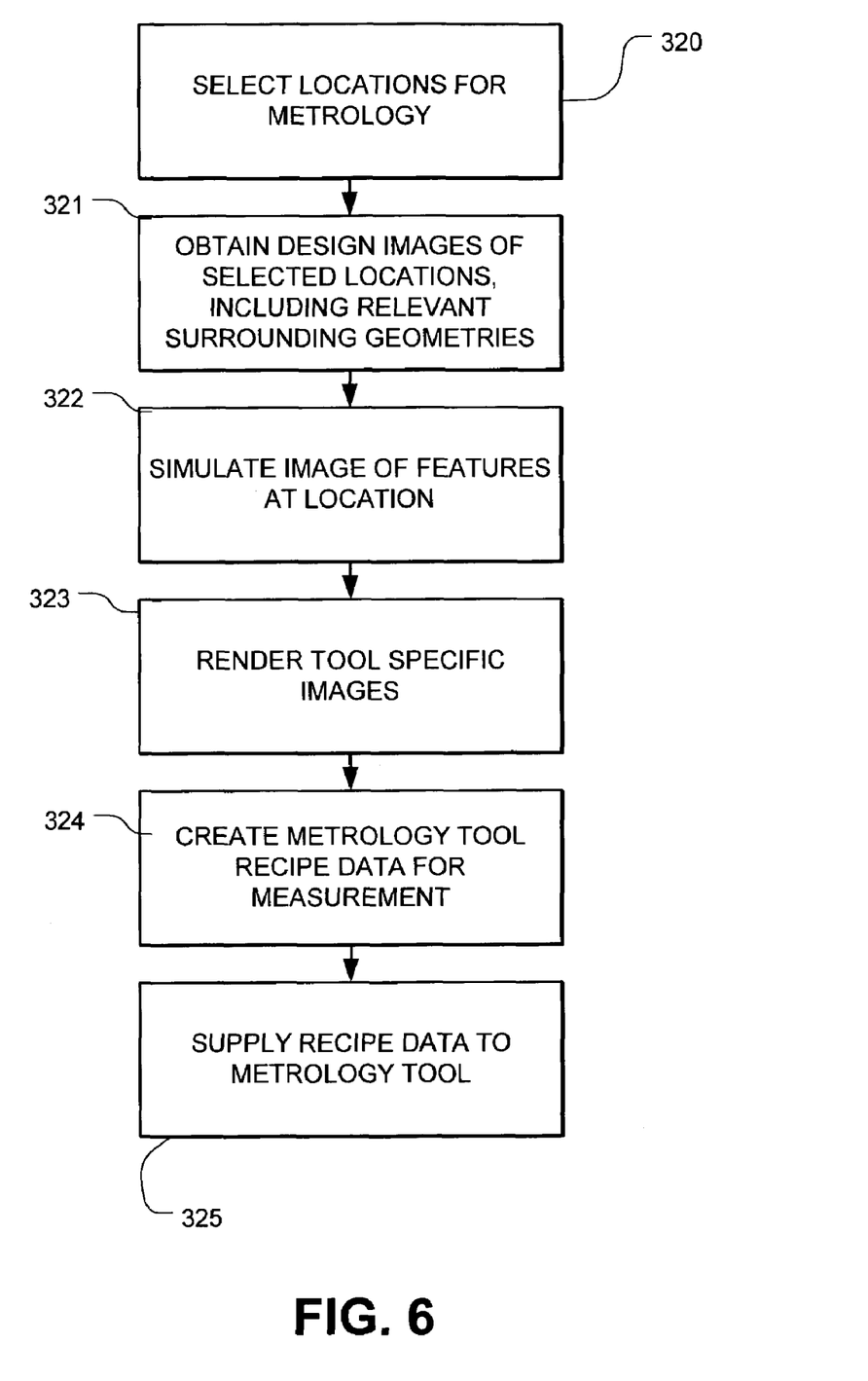
FIG. 6 is a flow diagram of a first process for setting up a metrology tool according to the present invention.

FIG. 6 illustrates a basic process according to one embodiment of the present invention. First, locations for metrology in the layout are selected (block 320). Next, images from the design layout or elsewhere of the selected locations are obtained, including surrounding geometries which may be relevant to the measurement and alignment (block 321). The process in a fully automated system simulates images of the selected features (block 322). Optionally, the system renders tool specific images, either by further processing of the simulated images, or by modifying a simulation machine so that tool specific images may be produced (block 323). In this manner, tool specific images are provided they can be better utilized by image recognition software in the metrology tool for alignment of the measurement. Next, metrology tool recipe data is created, including tool specific or non-tool specific image of the feature, and other parameters needed for set up by the metrology tool (block 324). Finally, the recipe data is supplied to metrology tool (block 325). In this manner, the metrology tool is set up using a fully automated process for a set of locations on the devices to be measured. The automation of the capturing a simulated images for use by the metrology tools, reduces the cost of setting up metrology processes by eliminating steps normally done by skilled engineers. The further automation of each is steps represented by blocks 320 through 325 in FIG. 6, provides further gains in increased efficiency and reduced cost.

Figure 7:
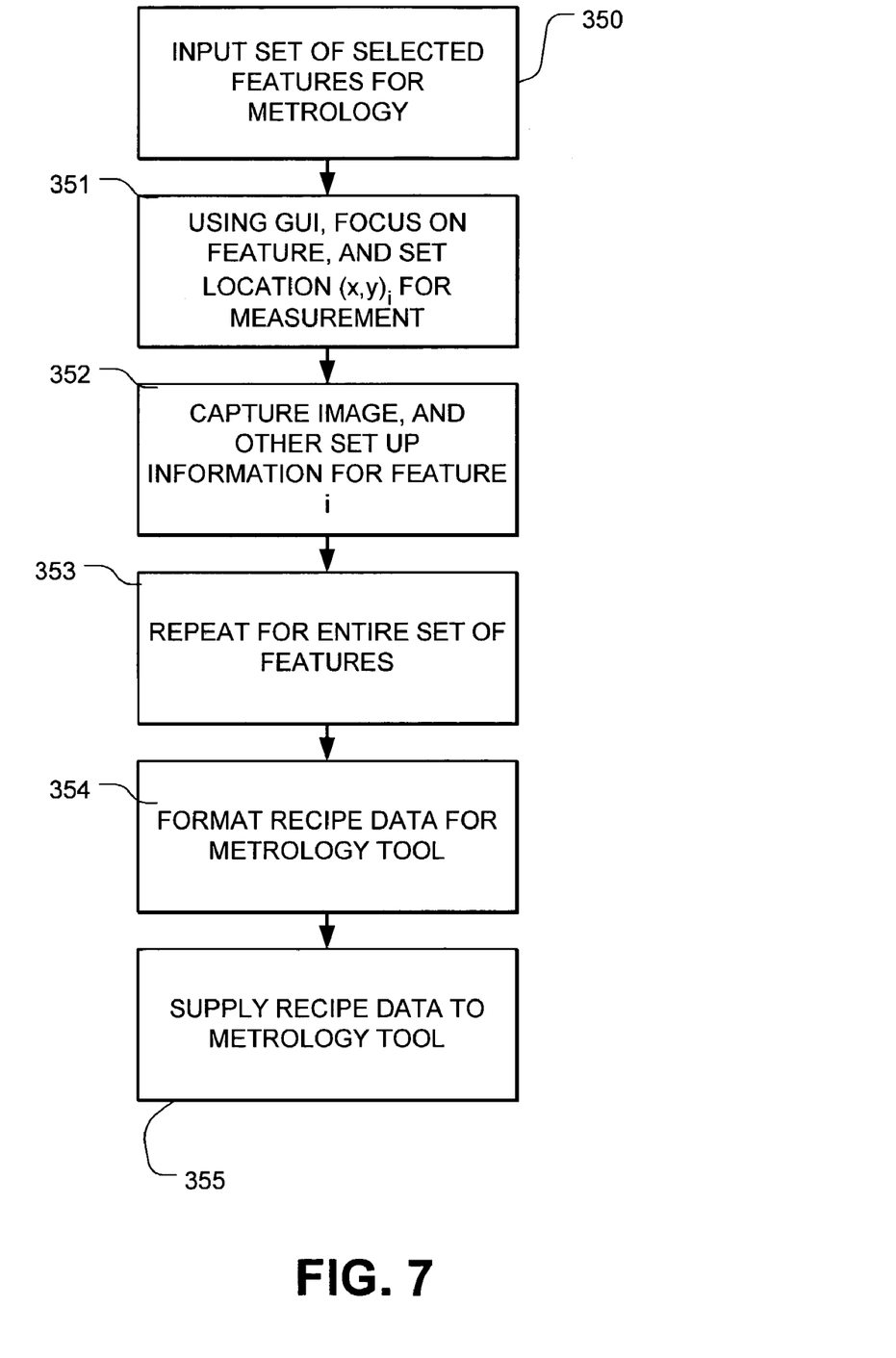
FIG. 7 is a flow diagram of a second process for setting up a metrology tool according to the present invention.

FIG. 7 shows a process flow for one embodiment of the present invention. In this embodiment, a set of selected features for metrology is provided as input to a workstation (block 350). The set of metrology features in this embodiment has been selected for measurements. Using a data processing system and the graphical user interface on the workstation, an image of the feature i is stimulated, and the screen focuses on the simulated feature. The user sets the measurement location $(x,y)_i$ for the measurement of feature i (block 351). The location setting comprises one or more points on the simulated image specified by the coordinates usable by the metrology tool, for locating a particular location on a corresponding feature on the device being measured. Next, the simulated image of the feature i is captured, and optionally other recipe data for the location $(x,y)_i$ is provided or computed. The recipe data for the feature i is stored in a machine-readable medium (block 352). This process of focusing (block 351) on a feature and simulating the image (block 352) for use in the recipe data is repeated for each feature in the set of selected features that are supplied as input (block 353). The recipe data is formatted for the recipe tool if necessary at the next step (block 354). Finally, in this embodiment, the recipe data is supplied to the controller for the metrology tool, via a network communication link or otherwise (block 355).

Figure 8:
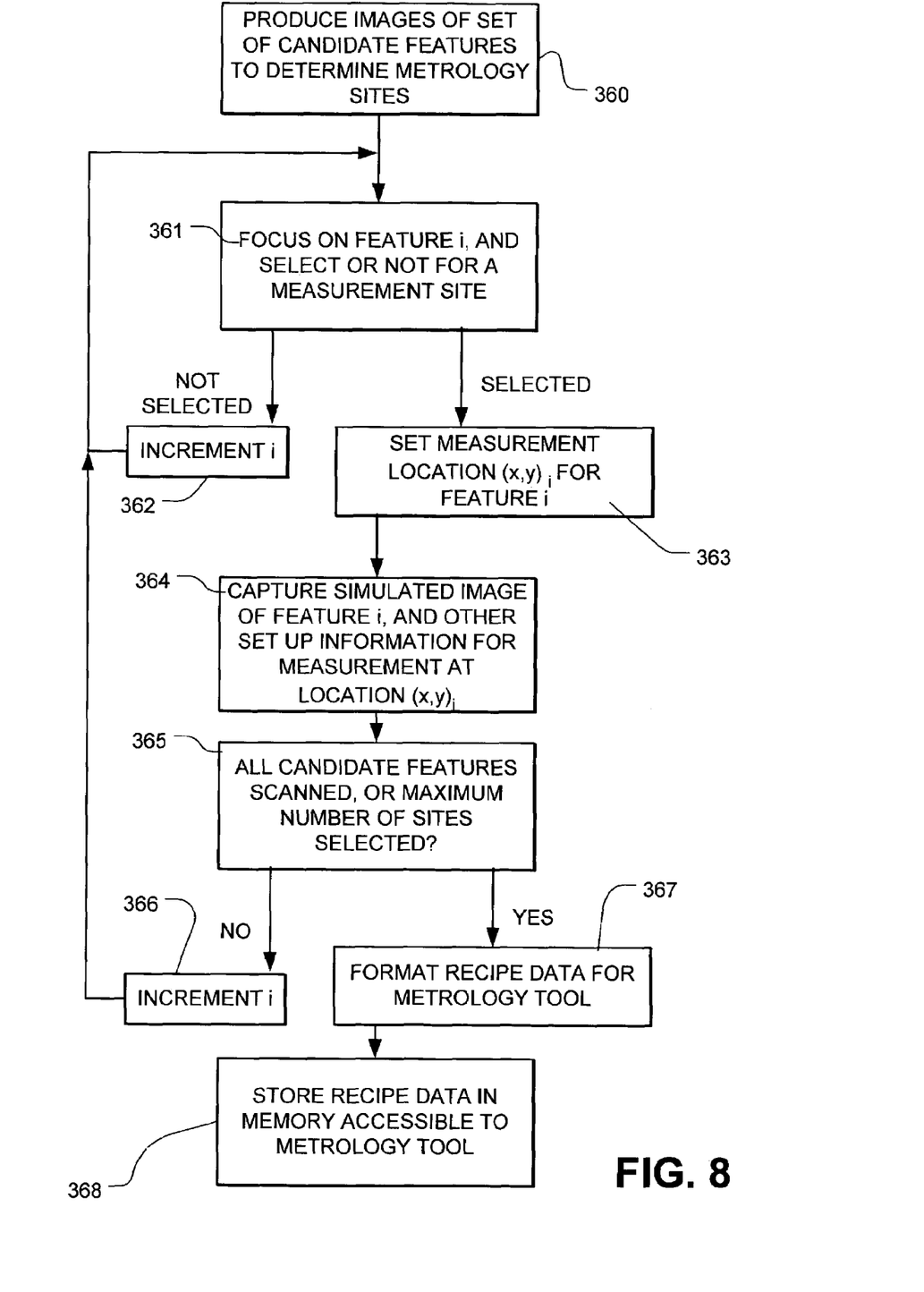
FIG. 8 is a flow diagram of a third process for setting up a metrology tool according to the present invention.

FIG. 8 illustrates a process flow for yet another embodiment of the present invention, in which the graphical user interface is used for selecting measurement sites from a set of candidate features. According to this process, images of a set of candidate features are produced using simulation tool (block 360). The selected images are automatically selected and simulated without user input, in some embodiments of the invention, by filtering a design layout based on critical dimensions, critical locations, critical process windows, target test patterns, error markers such as those provided by the SiVL® software from Numerical Technologies, Inc. of San Jose, Calif., and so on. Using the graphical user interface, the process focuses on a feature i in the set of candidate features, by displaying an image of the feature in an interface window (block 361). In some embodiments, data about the feature or the device relevant to the selection process is displayed with the simulated image, including for example process window computations, critical dimensions, error flags, and the like. For unselected features, the graphical user interface moves into the next feature in the set of candidate features in an order (block 362) based on index i in this example, and returns to block 360. For selected features, the user exercises the graphical user interface to set the measurement location $(x,y)_i$ for the feature i (block 363). Next, the workstation captures the simulated image of the feature i, and other set up information used as recipe data for measurement at the location $(x,y)_i$ is provided (block 364). The algorithm determines whether all the candidate features have been reviewed or the maximum number of sites has been selected for the metrology process (block 365). The maximum may be simply a user defined number of sites that they are willing to measure, rather than a hard limit. If all the candidate features have not been reviewed, then the index i is incremented (block 366) and the process returns to block 360. If all candidate sites have been reviewed, or the maximum number has been selected, then the data is formatted for the metrology tool (block 367). Of course, in this and other embodiments, the formatting may be executed at any point along the data collection path, such as after each location is selected, or after all locations have been selected for a given tool. Finally, the recipe data is stored in a machine-readable medium accessible to the metrology tool (block 368). Embodiments of the invention may also present the user with a choice of metrology tools for use to measure a particular feature reviewed as described herein. In this case, the production of recipe data includes identifying a metrology tool to be used for the selected features.

Figure 9:
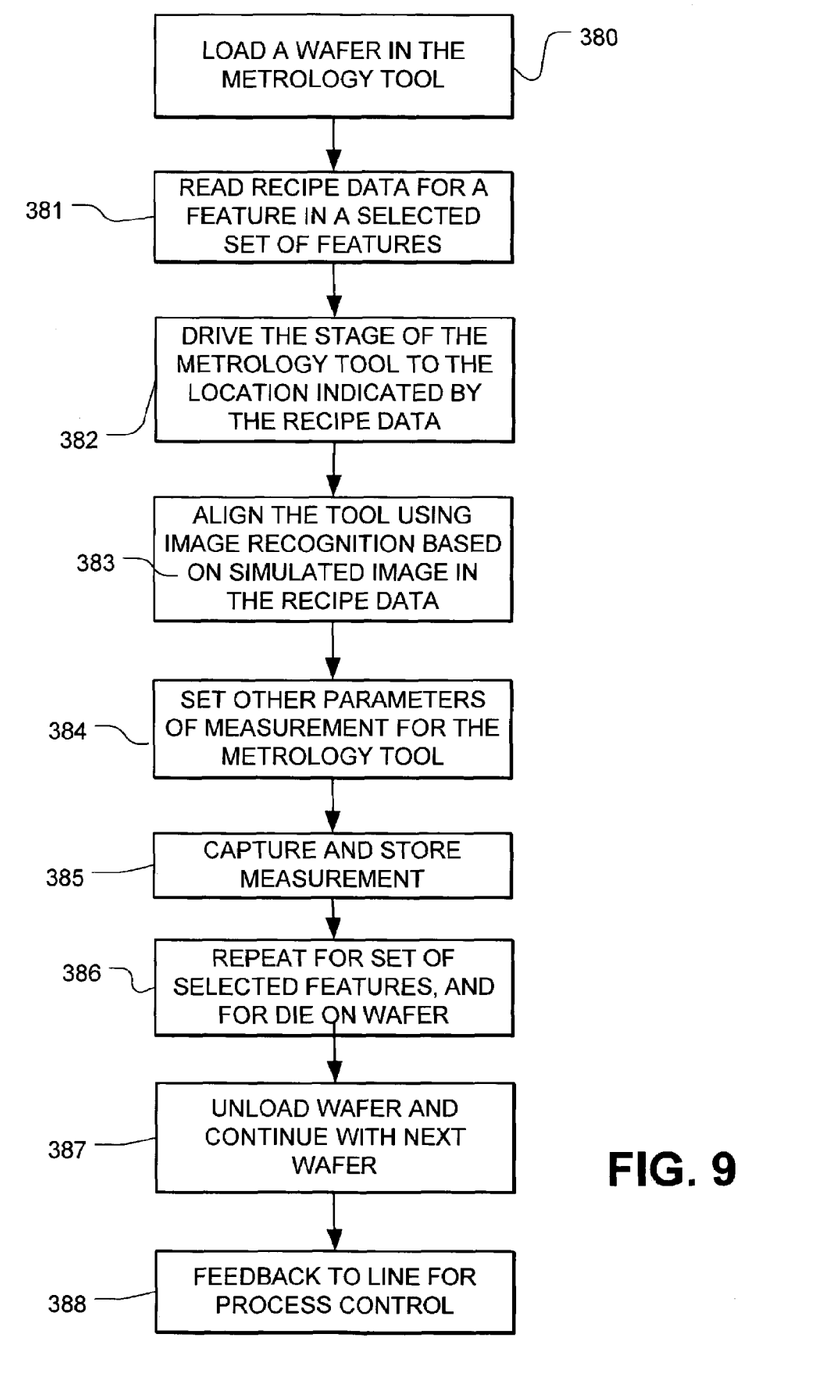
FIG. 9 is a flowchart of a metrology and manufacturing process according to the present invention, using simulated alignment images.

FIG. 9 shows a basic process flow manufacturing of integrated circuits, or other devices, using metrology according to the present invention. A wafer in the manufacturing line is delivered from process equipment, and loaded into the metrology tool (block 380). The controller for the metrology tool reads the recipe data for a feature in a selected a set of features (block 381). The controller drives the stage of the metrology tool to the feature indicated by the recipe data (block 382). Next, the controller aligns the tool with the measurement location, using image recognition based on the simulated image in the recipe data (block 383). The controller sets other parameters of the measurement from the recipe data, and/or from other data records, needed by the metrology tool to execute the measurement (block 384). The controller captures and stores the measurement in the next step (block 385). The process is repeated for the set of selected features, and for other die on a wafer (block 386). The wafer is unloaded from the metrology tool, and delivered to process equipment or a storage cassette, and the process continues with the next wafer (block 387). The measurement data is compiled for feedback to the manufacturing line for real-time process control in this embodiment (block 388). The results of the metrology is used in some embodiments, as a go or no-go decision flag on the wafer being measured. In other embodiments, the results may be used as a control signal causing the manufacturing line to stop operating until corrective measures are taken in the manufacturing line.

In modern manufacturing, metrology can be critical to successful manufacturing of complicated devices. The present invention leverages advances in the design of data structures, and in simulation technology, used in the design of complicated devices such as integrated circuits to improve the design and manufacturing processes for such devices by automating metrology set up procedures. Automated metrology processes according to the present invention leverage data processing technology based on design layout databases and simulation engines to reduce the time required from engineers for metrology set up, and to improve the flexibility of metrology set up process. The invention provides new data structures for metrology recipe data, data processing systems and metrology systems using new metrology tool set up procedures, and manufacturing lines leveraging the efficiency of metrology set up, utilizing simulated images for setting measurement locations and for alignment of metrology tools. Thus, significant advances in the efficiency of metrology and the quality of manufacturing are provided.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. the following claims.

What is claimed is:

1. A method for setting up a metrology tool used to measure features of a device, comprising:
   processing a design database 1) accessing previously simulated images of features supporting alignment with the metrology tool and 2) characterizing features on the device to produce a simulated image of a feature for use in the metrology tool for a measurement of the feature; and
   supplying the simulated image to the metrology tool.

2. The method of claim 1, including:
   using the simulated image as a basis for image recognition for alignment of the metrology tool.

3. The method of claim 1, including:
   using the simulated image as a basis for image recognition for alignment of the metrology tool; and
   capturing a measurement using the metrology tool.

4. The method of claim 1, including:
   generating a simulation of said feature; and
   processing said simulation of said feature according to parameters of the metrology tool to render the simulated image.

5. The method of claim 1, wherein said processing the design database to produce a simulated image includes applying parameters of the metrology tool in combination with the design database to render the simulated image.

6. The method of claim 1, including:
   providing recipe data in addition to the simulated image for use by the metrology tool.

7. A method for setting up a metrology tool used to measure features of a device, comprising:
   processing a design database 1) accessing previously simulated images of features supporting alignment with the metrology tool and 2) characterizing features on the device to produce recipe data for the metrology tool for measurements of a set of selected features on the device, the recipe data for a selected feature including a location on the selected feature for said measurement and at least one of a simulated image of the selected feature and a pointer to said simulated image; and
   storing the recipe data in a machine readable medium accessible to the metrology tool, for measurements using the metrology tool.

8. The method of claim 7, including transmitting the recipe data to the metrology tool via a data communication medium in response to a request.

9. The method of claim 7, including applying rules that filter features in the design database according to characteristics of the features to identify features in the set of selected features.

10. The method of claim 7, including:
    storing an image of at least one of the features in the set of selected features, and wherein said recipe data includes at least one of said stored image and a pointer to said stored image.

11. The method of claim 7, including applying rules that filter features in the design database according to characteristics of the features to produce a set of candidate features for the set of selected features, wherein said rules include a rule that specifies halos for corresponding features in the design database, the halo corresponding to a particular feature characterizing an area surrounding the particular feature, and that identifies features in the design database for which another feature overlaps the halo of the particular feature.

12. The method of claim 7, including:
    simulating an image of at least one of the features in the set of selected features, storing the simulated image.

13. The method of claim 7, wherein said metrology tool comprises a scanning electron microscope, and including
    using the simulated image from the recipe data for alignment of the scanning electron microscope during set up for a measurement of the feature.

14. The method of claim 7, including providing a representative image of the device, and presenting the representative image of the device to a user with a graphical user interface by which features in the set of selected features may be selected.

15. The method of claim 7, including applying rules that filter features in the design database according to characteristics of the features to produce a set of candidate features, presenting representative images of the set of candidate features to a user with a graphical user interface by which features in the set of selected features may be selected.

16. The method of claim 7, wherein using the set of locations includes:
    reading recipe data for a feature in said set of selected features;
    using the recipe data, driving the metrology tool to a location indicated in the recipe data;
    capturing a measurement at the location; and
    repeating said reading, driving and capturing until measurements of said set of selected features is completed on the device.

17. The method of claim 7, wherein said device comprises a part of a wafer including a plurality of devices, and using the set of locations includes:
    reading recipe data for a feature in said set of selected features;
    using the recipe data, driving the metrology tool to a location indicated in the recipe data;
    capturing a measurement at the location;
    repeating said reading, driving and capturing until measurements of said set of selected features is completed on the device; and
    driving the metrology tool to another device on the wafer.

18. The method of claim 7, wherein using the set of locations includes:
    reading recipe data for a feature in said set of selected features;
    using the recipe data, driving the metrology tool to a location indicated in the recipe data;
    using the simulated image as a basis for image recognition for alignment of the metrology tool; and
    capturing a measurement at the location;.

19. The method of claim 7, wherein said design database comprises a hierarchical design data base, with nodes in the hierarchy corresponding with features of said device, and including linking said recipe data for the set of selected features, with corresponding nodes in the hierarchy.

20. A method for setting up recipes for a metrology tool used to measure features of a device characterized by a design database, comprising:
    identifying a set of selected features on the device;
    simulating an image of at least one feature in said set of selected features using said design database accessing previously simulated images of features supporting alignment with the metrology tool;
    providing recipe data for said set of selected features, the recipe data for said at least one feature including location data and one of said image and a pointer to said image; and
    storing the recipe data in a machine readable medium for use by a metrology tool.

21. A method for setting up a metrology tool used to measure features of a device, comprising:
    processing a design database 1) accessing previously simulated images of features supporting alignment with the metrology tool and 2) characterizing features on the device to identify a set of candidate features for metrology;
    presenting the set of candidate features to a user with a graphical user interface by which features from the set of candidate features are selected;
    for features selected from the set of candidate features, presenting an image of a selected feature to the user with a graphical user interface by which a location for measurement on the selected feature is set, and providing recipe data for measurements of the selected feature, the recipe data including the location for measurement and one of an image of the feature and a pointer to an image of the feature; and
    storing the recipe data for selected features in memory accessible by the metrology tool.

22. The method of claim 21, including transmitting the recipe data to the metrology tool via a data communication medium in response to a request.

23. The method of claim 21, wherein processing the design database includes applying rules that filter features in the design database according to characteristics of the features to identify features in the candidate set of features.

24. The method of claim 21, wherein processing the design database includes applying rules that filter features in the design database according to characteristics of the features to produce the set of candidate features, wherein said rules including a rule that specifies halos for corresponding features in the design database, the halo corresponding to a particular feature characterizing an area surrounding the particular feature, and that identifies features in the design database for which another feature overlaps the halo of the particular feature.

25. The method of claim 21, wherein said metrology tool comprises a scanning electron microscope, and including
    using the stored image from the recipe data for alignment of the scanning electron microscope during set up for a measurement of the feature.

26. The method of claim 21, including:
    reading recipe data for a feature in said selected features;
    using the recipe data, driving the metrology tool to a location indicated in the recipe data;
    capturing a measurement at the location; and
    repeating said reading, driving and capturing until measurements of said selected features is completed on the device.

27. The method of claim 26, wherein said device comprises a part of a wafer including a plurality of devices, and including:
   driving the metrology tool to another device on the wafer.

28. The method of claim 21, wherein said design database comprises a hierarchical design data base, with nodes in the hierarchy corresponding with features of said device, and including linking said recipe data for the set of selected features, with corresponding nodes in the hierarchy.

29. A data processing system, including:
   a data processor; and
   a memory system, in communication with the data processor, the memory system storing a design database 1) accessing previously simulated images of features supporting alignment with a metrology tool and 2)characterizing features of a device, and programs of instruction executable by the data processor, the programs of instruction including simulation code for simulating images of features, and code that processes the design database to produce recipe data for measurements of a set of selected features on the device, the recipe data for a particular feature in the selected set including a measurement location on the device for said measurement and one of a simulated image of the particular feature and a pointer to the simulated image; and that stores the recipe data in the memory system for measurements using the metrology tool.

30. The system of claim 29, including a metrology tool, and a data communication medium coupled to the metrology tool and the memory system, the metrology tool including client logic to request recipe data from the memory system.

31. The system of claim 29, the programs of instruction including logic applying rules that filter features in the design database according to characteristics of the features to identify features in the set of selected features.

32. The system of claim 29, the programs of instruction including logic storing an image of at least one of the features in the set of selected features, and wherein said recipe data includes at least one of said stored image and a pointer to said stored image.

33. The system of claim 29, the programs of instruction including logic applying rules that filter features in the design database according to characteristics of the features to produce a set of candidate features for the set of selected features, wherein said rules include a rule that specifies halos for corresponding features in the design database, the halo corresponding to a particular feature characterizing an area surrounding the particular feature, and that identifies features in the design database for which another feature overlaps the halo of the particular feature.

34. The system of claim 29, the programs of instruction including logic simulating an image of at least one of the features in the set of selected features, storing the simulated image, and wherein said recipe data includes at least one of said stored simulated image and a pointer to said stored simulated image.

35. The system of claim 29, the programs of instruction including logic:
   capturing an image of at least one of the features in the set of selected features from a device, storing the captured image, and wherein said recipe data includes at least one of said stored captured image and a pointer to said stored captured image.

36. The system of claim 29, wherein said metrology tool comprises a scanning electron microscope, and the programs of instruction include logic
   storing an image of at least one of the features in the set of selected features, and wherein said recipe data includes at least one of said stored image and a pointer to said stored image, and
   using the stored image from the recipe data for alignment of the scanning electron microscope during set up for a measurement of the feature.

37. The system of claim 29, the programs of instruction including logic providing a representative image of the device, and presenting the representative image of the device to a user with a graphical user interface by which features in the set of selected features may be selected.

38. The system of claim 29, the programs of instruction including applying rules that filter features in the design database according to characteristics of the features to produce a set of candidate features, presenting representative images of the set of candidate features to a user with a graphical user interface by which features in the set of selected features may be selected.

39. The system of claim 29, the programs of instruction including logic:
   reading recipe data for a feature in said set of selected features;
   using the recipe data, driving the metrology tool to a location indicated in the recipe data;
   capturing a measurement at the location; and
   repeating said reading, driving and capturing until measurements of said set of selected features is completed on the device.

40. The system of claim 39, wherein said device comprises a part of a wafer including a plurality of devices, and the programs of instruction include logic:
   driving the metrology tool to another device on the wafer.

41. The system of claim 29, wherein the recipe data includes a stored image of the feature, and the programs of instruction include logic using the stored image as a basis for image recognition for alignment of the metrology tool.

42. The system of claim 29, wherein said design database comprises a hierarchical design data base, with nodes in the hierarchy corresponding with features of said device, and the programs of instruction include logic linking said recipe data for the set of selected features, with corresponding nodes in the hierarchy.

43. A metrology system, including:
   a communication network;
   a metrology tool, including a controller coupled to the communication network;
   a data processor coupled to the communication network; and
   a memory system, in communication with the data processor and the metrology tool, the memory system storing a design database 1) accessing previously simulated images of features supporting alignment with the metrology tool and 2) characterizing features of a device, and programs of instruction executable by the data processor and the controller for the metrology tool, the programs of instruction including simulation code for simulating images of features, and code that processes the design database to produce recipe data for measurements of a set of selected features on the device, the recipe data for a particular feature in the selected set including a measurement location on the device for said measurement and one of a simulated image of the particular feature and a pointer to the simulated image; and that stores the recipe data in the memory accessible by the metrology tool for measurements using the metrology tool.

44. The system of claim 43, the programs of instruction including logic applying rules that filter features in the design database according to characteristics of the features to identify features in the set of selected features.

45. The system of claim 43, the programs of instruction including logic storing an image of at least one of the features in the set of selected features, and wherein said recipe data includes at least one of said stored image and a pointer to said stored image.

46. The system of claim 43, the programs of instruction including logic applying rules that filter features in the design database according to characteristics of the features to produce a set of candidate features for the set of selected features, wherein said rules include a rule that specifies halos for corresponding features in the design database, the halo corresponding to a particular feature characterizing an area surrounding the particular feature, and that identifies features in the design database for which another feature overlaps the halo of the particular feature.

47. The system of claim 43, the programs of instruction including logic simulating an image of at least one of the features in the set of selected features, storing the simulated image, and wherein said recipe data includes at least one of said stored simulated image and a pointer to said stored simulated image.

48. The system of claim 43, the programs of instruction including logic:
capturing an image of at least one of the features in the set of selected features from a device, storing the captured image, and wherein said recipe data includes at least one of said stored captured image and a pointer to said stored captured image.

49. The system of claim 43, wherein said metrology tool comprises a scanning electron microscope, and the programs of instruction include logic
storing an image of at least one of the features in the set of selected features, and wherein said recipe data includes at least one of said stored image and a pointer to said stored image, and
using the stored image from the recipe data for alignment of the scanning electron microscope during set up for a measurement of the feature.

50. The system of claim 43, the programs of instruction including logic providing a representative image of the device, and presenting the representative image of the device to a user with a graphical user interface by which features in the set of selected features may be selected.

51. The system of claim 43, the programs of instruction including applying rules that filter features in the design database according to characteristics of the features to produce a set of candidate features, presenting representative images of the set of candidate features to a user with a graphical user interface by which features in the set of selected features may be selected.

52. The system of claim 43, the programs of instruction including logic:
reading recipe data for a feature in said set of selected features;
using the recipe data, driving the metrology tool to a location indicated in the recipe data;
capturing a measurement at the location; and
repeating said reading, driving and capturing until measurements of said set of selected features is completed on the device.

53. The system of claim 52, wherein said device comprises a part of a wafer including a plurality of devices, and the programs of instruction include logic:
driving the metrology tool to another device on the wafer.

54. The system of claim 43, wherein the recipe data includes a stored image of the feature, and the programs of instruction include logic using the stored image as a basis for image recognition for alignment of the metrology tool.

55. The system of claim 43, wherein said design database comprises a hierarchical design data base, with nodes in the hierarchy corresponding with features of said device, and the programs of instruction include logic linking said recipe data for the set of selected features, with corresponding nodes in the hierarchy.

56. An article of manufacture providing computer programs for setting up a metrology tool for measurement of features on a device, the device being characterized by a design database characterizing features of a device, comprising:
a machine readable data storage medium storing programs of instruction executable by a data processor in one of a workstation and a controller for the metrology tool, the programs of instruction including simulation code for simulating images of features, and code that processes the design database to 1) access previously simulated images of features supporting alignment with the metrology tool and 2) to produce recipe data for measurements of a set of selected features on the device, the recipe data for a particular feature in the selected set including a measurement location on the device for said measurement and one of a simulated image of the particular feature and a pointer to the simulated image; and that stores the recipe data in the memory accessible by the metrology tool for measurements using the metrology tool.

57. The article of claim 56, the programs of instruction including logic applying rules that filter features in the design database according to characteristics of the features to identify features in the set of selected features.

58. The article of claim 56, the programs of instruction including logic storing an image of at least one of the features in the set of selected features, and wherein said recipe data includes at least one of said stored image and a pointer to said stored image.

59. The article of claim 56, the programs of instruction including logic applying rules that filter features in the design database according to characteristics of the features to produce a set of candidate features for the set of selected features, wherein said rules include a rule that specifies halos for corresponding features in the design database, the halo corresponding to a particular feature characterizing an area surrounding the particular feature, and that identifies features in the design database for which another feature overlaps the halo of the particular feature.

60. The article of claim 56, the programs of instruction including logic simulating an image of at least one of the features in the set of selected features, storing the simulated image, and wherein said recipe data includes at least one of said stored simulated image and a pointer to said stored simulated image.

61. The article of claim 56, the programs of instruction including logic:
capturing an image of at least one of the features in the set of selected features from a device, storing the captured image, and wherein said recipe data includes at least one of said stored captured image and a pointer to said stored captured image.

62. The article of claim 56, the programs of instruction including logic providing a representative image of the device, and presenting the representative image of the device to a user with a graphical user interface by which features in the set of selected features may be selected.

63. The article of claim 56, the programs of instruction including applying rules that filter features in the design database according to characteristics of the features to produce a set of candidate features, presenting representative images of the set of candidate features to a user with a graphical user interface by which features in the set of selected features may be selected.

64. The article of claim 56, wherein said design database comprises a hierarchical design data base, with nodes in the hierarchy corresponding with features of said device, and the programs of instruction include logic linking said recipe data for the set of selected features, with corresponding nodes in the hierarchy.

65. A semiconductor manufacturing method, including:
   forming a structure having a plurality of features on a wafer with processing equipment using lithographic processes;
   loading the wafer in a metrology tool;
   reading recipe data for a feature of said structure in a set of selected features;
   aligning the metrology tool for a measurement on the feature using the recipe data, the recipe data including a simulated image of the feature at least partly formed from a stored previously simulated image and supporting said alignment;
   capturing results of the measurement;
   repeating the reading, aligning and capturing steps for the set of selected features;
   processing the captured results for process control in the processing equipment.

66. The manufacturing method of claim 65, including:
   processing a design database characterizing features on the device to produce recipe data for measurements of said set of selected features, the recipe data for a selected feature including a location on the selected feature for said measurement and said simulated image.

* * * * *